United States Patent [19]

Boardman et al.

[11] Patent Number: 5,120,679

[45] Date of Patent: Jun. 9, 1992

[54] ANTI-FUSE STRUCTURES AND METHODS FOR MAKING SAME

[75] Inventors: William J. Boardman, San Jose; David P. Chan, San Ramon; Kuang-Yeh Chang, Los Gatos; Calvin T. Gabriel, Pacifica; Vivek Jain, Milpitas; Subhash R. Nariani, San Jose, all of Calif.

[73] Assignee: VLSI Technology, Inc., San Jose, Calif.

[21] Appl. No.: 710,220

[22] Filed: Jun. 4, 1991

[51] Int. Cl.⁵ .................. H01L 21/311; H01L 21/90
[52] U.S. Cl. .............................. 437/195; 437/52; 437/192; 437/193; 437/922; 148/DIG. 55
[58] Field of Search ............. 148/DIG. 55; 437/189, 437/195, 922, 52, 192, 203, 228, 191, 193; 357/71

[56] References Cited

U.S. PATENT DOCUMENTS

| | | | |
|---|---|---|---|
| 4,569,120 | 2/1986 | Stacy et al. | 148/DIG. 55 |
| 4,569,121 | 2/1986 | Lim et al. | 437/178 |
| 4,651,409 | 3/1987 | Ellsworth et al. | 437/922 |
| 4,751,197 | 6/1988 | Wills | 437/174 |
| 4,898,841 | 2/1990 | Ho | 437/200 |
| 4,914,055 | 4/1990 | Gordon et al. | 437/192 |
| 4,943,538 | 7/1990 | Mohsen et al. | 437/59 |
| 4,962,414 | 10/1990 | Liou et al. | 357/71 |
| 5,011,791 | 4/1991 | Mastroianni | 437/180 |
| 5,066,612 | 11/1991 | Ohba et al. | 437/192 |

FOREIGN PATENT DOCUMENTS 60-128640  7/1985  Japan ..................... 148/DIG. 55

Primary Examiner—T. N. Quach
Attorney, Agent, or Firm—Hickman, Frazzini & King

[57] ABSTRACT

An anti-fuse structure characterized by a substrate, an oxide layer formed over the substrate having an opening formed therein, an amorphous silicon material disposed within the opening and contacting the substrate, and oxide spacers lining the walls of a recess formed within the amorphous silicon. The spacers prevent failures of the anti-fuse structures by covering cusps formed in the amorphous silicon material. The method of the present invention forms the above-described anti-fuse structure and further solves the problem of removing unwanted spacer material from areas outside of the anti-fuse structure locations.

16 Claims, 5 Drawing Sheets

ANTI-FUSE STRUCTURES AND METHODS FOR MAKING SAME

BACKGROUND OF THE INVENTION

This invention relates generally to integrated circuits and more particularly to anti-fuse structures for field programmable gate arrays, programmable read-only memories (PROMS) and the like.

Field programmable gate arrays include a large number of logic elements, such as AND gates and OR gates, which can be selectively coupled together by means of fuses or anti-fuses to perform user designed functions. An unprogrammed fuse-type gate array is programmed by selectively blowing fuses within the device, while an unprogrammed anti-fuse type gate array is programmed by causing selected anti-fuses to become conductive.

There are many types of PROMS including standard, write-once PROMS, erasable programmable read-only memories (EPROMS), electrically erasable programmable read-only memories (EEPROMS) etc. A PROM usually comprises an array of memory cells arranged in rows and columns which can be programmed to store user data. PROMS are typically fuse-type devices.

Fuses for field programmable gate arrays, PROMS and the like are typically made from a titanium-tungsten (TiW) alloy and are shaped somewhat like a bow-tie having a narrow, central neck and wide ends. The neck of the fuse is typically about 2 microns wide, while the ends of the fuse are typically about 6 microns wide. When a sufficiently high voltage, usually on the order of 10 volts d.c., is applied to the fuse, the current flowing through the fuse will cause it to heat-up and will eventually melt the fuse at its neck, thereby "blowing" the fuse.

Anti-fuses include a material which initially has a high resistance but which can be converted into a low resistance material by the application of a programming voltage. For example, amorphous silicon, which has an intrinsic resistivity of approximately 1 megohms-cm, can be fashioned into 1 micron wide link vias having a resistance of approximately 1-2 gigohms. These link vias can then be melted and recrystallized by the application of the of a voltage in the range of 10-12 volts d.c. to form link vias having a resistance less than 200 ohms. These low resistance vias can couple together logic elements of a field programmable gate array so that the gate array will perform user-desired functions, or can serve as memory cells of a PROM.

Fuses in electronic devices are much more prevalent today than anti-fuses because they are easier to manufacture and have a better record of reliability. A problem with anti-fuses is that the anti-fuse material tends to have imperfections, such as creases known as "cusps", which can result in the failure of the anti-fuse structure. Unfortunately, even one bad fuse or anti-fuse structure in a device is often sufficient to render the entire device defective.

A problem encountered in making anti-fuses is that the typical anti-fuse material, amorphous silicon, is somewhat delicate. For example, it has been found that if aluminum is permitted to contact amorphous silicon that it will diffuse into the silicon, thereby lowering the resistance of the silicon to the point where an anti-fuse might give a false reading.

Despite the difficulty in manufacturing anti-fuse structures and their relative lack of reliability, they do have the very desirable feature of being small in size. For example, a TiW fuse with a 2 micron neck and 6 micron end widths permits approximately 4,000 fuses to be provided on a typical device. In contrast, a 1 or 1.2 micron diameter anti-fuse via permits 80,000-100,000 anti-fuses to be provided on a single device. Therefore, anti-fuses have the potentiality of providing vastly greater numbers of interconnections or of storing much greater amounts of information that devices using fuse technology.

SUMMARY OF THE INVENTION

The present invention provides an anti-fuse structure which is very reliable which can be conveniently manufactured by standard processes. As a result, powerful and reliable field programmable arrays, PROMS and similar devices can be manufactured using anti-fuse technology rather than the more common fuse technology.

The anti-fuse structure includes a substrate, an insulating layer provided over the substrate having an opening which extends down to the substrate, an anti-fuse material disposed within the opening and contacting the substrate, where the anti-fuse material generally conforms to the contours of the opening to form a recess having sidewall portions and a base portion which meet at an interface, and spacers provided on the sidewall portions of the recess. The spacers cover any cusps which may be present in the amorphous silicon layer so that only the thicker, central areas of the base portion are exposed to a programming voltage.

The anti-fuse material of choice is amorphous silicon and the conductive material that it contacts is preferably an alloy of titanium and tungsten (TiW) which will not diffuse into the amorphous silicon to any significant degree. The insulating layer and spacers preferably comprise silicon dioxide.

A method for making an anti-fuse structure includes the step of providing a substrate surface, forming an insulating layer over the substrate surface, forming an opening in the insulating layer which extends down to the substrate surface, depositing an anti-fuse material into the opening such that it generally conforms to the contours of the opening to form a recess therein having a sidewall portion and a base portion which meet at an interface, and forming spacers within the recess to substantially cover the interface between the sidewall portion and the base portion. Preferably, the substrate surface is prepared by depositing a conductive material on a support surface and patterning the conductive material.

The method of the present invention further provides for the removal of spacer material from outside the location of the anti-fuse structure by masking those locations and then etching away the extraneous spacer material.

The spacers of the present invention substantially reduce the failure of the anti-fuse structures and therefore greatly increase the yield of functioning devices for a given semiconductor wafer. The process of the present invention increases yield by removing extraneous spacer material and is advantageously implemented with standard processing steps.

These and other advantages of the present invention will become clear to those skilled in the art upon a study of the detailed description of the invention and of the several figures of the drawings.

DETAILED DESCRIPTION OF THE PREFERRED EMBODIMENTS

Figure 1:
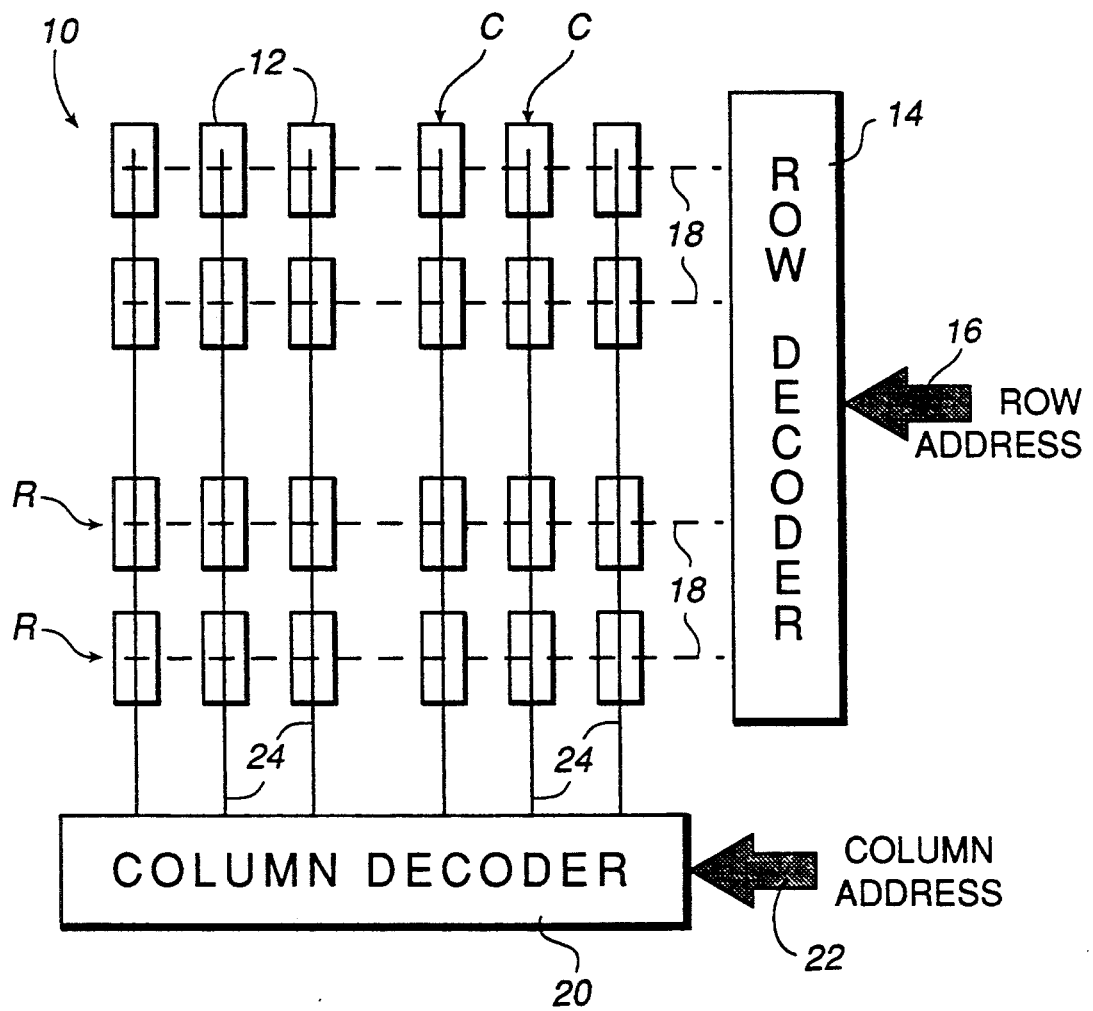
FIG. 1 is a schematic view of an array of anti-fuses.

FIG. 1 illustrates an array 10 of anti-fuse structures 12 arranged in rows R and columns C. A row decoder 14 has an input coupled to a row address bus 16 and is connected to the rows R by a number of row lines 18. A column decoder 20 has an input coupled to a column address bus 22 and is connected to the column C by a number of column lines 24. In a field programmable gate array the anti-fuse structures 12 are coupled between logic elements of the gate array and in a PROM the anti-fuse structures 12 are coupled to bit and word lines so that their logical state can be read.

Initially, the array 10 is unprogrammed, i.e. each of the anti-fuse structures 12 are in their high resistance state. The array 10 can be programmed by applying a row address to row decoder 14 to select one of the row lines 18 and by applying a column address to column decoder 20 to select one of the column lines 24. The anti-fuse structure 12 which is at the intersection of the row line and the column line will then be permanently and irreversibly programmed to its low resistance state. The entire array 10 can be programmed by sequentially programming individual anti-fuse structures 12.

Figure 2:
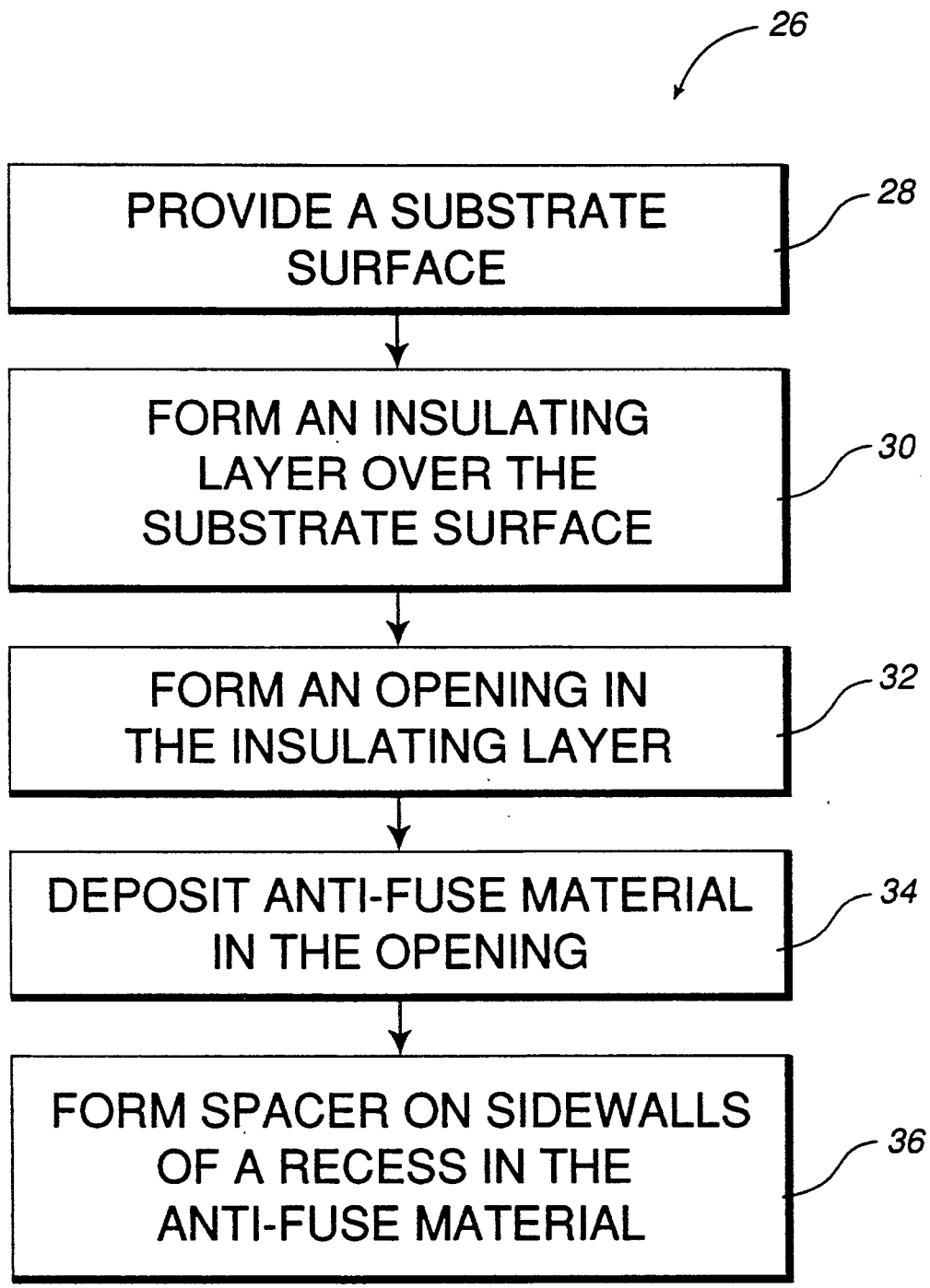
FIG. 2 is a flow diagram of the process of the present invention.

FIG. 2 illustrates a basic process 26 for making an improved anti-fuse structure. In a first step 28, a substrate for the anti-fuse structure is provided. This substrate typically includes a conductive line comprising either a row line 18 or a column line 24. In a step 30, an insulating layer, such a layer of silicon dioxide ($SiO_2$), is formed over the substrate. Next, in steps 32 and 34 an opening is formed in the insulating layer and an anti-fuse material is deposited into the opening. The anti-fuse material tends to conform to the contours of the opening and therefore forms a recess which may be cusped at the interface between its sidewall portions and its base portion. Finally, spacers are formed along the sidewall portions of the recess in the anti-fuse material to cover the interface regions of the anti-fuse material. By covering the interface regions, the reliability and yield of the array 10 is greatly increased.

Figure 3A:
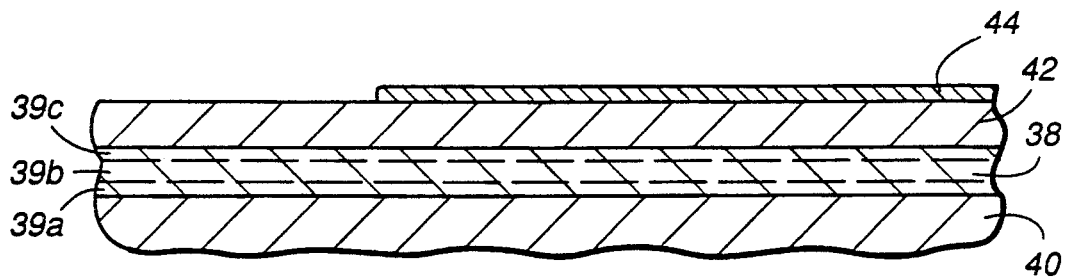
FIGS. 3a–3h illustrate the manufacturing steps for an anti-fuse structure made in accordance with the process of FIG. 2.

In FIGS. 3a–3h sequentially illustrate the intermediate structures produced by the steps of process 26. In FIG. 3a, a metal layer 38 is deposited over an insulating layer 40 of a semiconductor wafer. Insulating layer 40 is preferably a silicon-dioxide layer deposited over a six or eight inch diameter semiconductor grade silicon wafer. The metal layer 38 is preferably a three layer metal sandwich including layers 39a, 39b, and 39c. Layer 39a is preferably a 2000 angstrom thick layer of a 22:78 percent alloy of TiW, which serves as a barrier layer. Layer 39b is preferably a 4000 angstrom thick layer of a 99:1 percent alloy of aluminum and copper. Layer 39c is preferably an 800 angstrom thick layer of TiW which serves as an anti-reflective coating and which helps control electromigration.

The composite metal layer 38 is preferably deposited by a sputter deposition system, which is commercially available from such companies as Varian, Inc. of Palo Alto, Calif. and Applied Materials, Inc. of Santa Clara, Calif. The metal layer 38 is then patterned by a photolithography process to form interconnect lines.

The photolithography process, which is well known to those skilled in the art, involves the application of a resist to the metal layer 38, the exposure of the resist in a contact or stepper lithography system, the development of the resist to form a mask, and the etching of the metal layer 38 within a plasma etching system available from such companies as the aforementioned Applied Materials, Inc. As used herein, the term "patterned" will mean the formation of a mask over a layer, the etching of the layer through the mask, and the removal of the mask.

Next, an insulating layer 42 approximately 1 micron thick is deposited over the etched metal layer 38. The insulating layer 42, which also typically comprises silicon dioxide, is preferably provided by a commercially avaiable chemical vapor deposition system available from such companies as Novellus, Inc. of San Jose, Calif. and Applied Materials, Inc. A conductive layer 44 is then formed over the insulating layer 42. Preferably, conductive layer 44 is a layer of TiW approximately 2000 angstroms thick. Advantages of this TiW layer are that it, unlike aluminum, will not diffuse into silicon to any appreciable degree and that it has a very smooth surface. The conductive layer 44 is then patterned to form the row lines 18 shown in FIG. 1. The structure shown in FIG. 3a comprises the culmination of the step 28 of process 26 to provide a substrate surface for an anti-fuse structure.

Figure 3B:
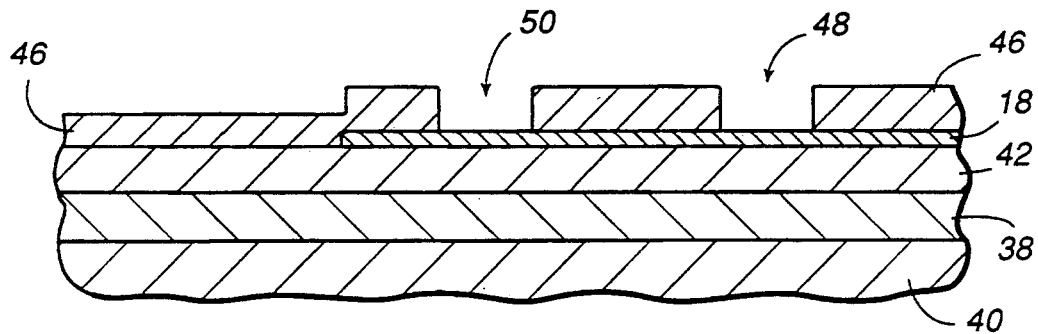

In FIG. 3b, an insulating layer 46 is formed over the surface of the structure of FIG. 3a. The insulating layer 46 is again preferably silicon dioxide and is deposited to a depth of approximately 3000 angstroms. An opening 48 and a via hole 50 are formed in the insulating layer 46 down to row line 18 in a patterning step. The structure of FIG. 3b illustrates the culmination of process steps 30 and 32 of process 26.

Figure 3C:
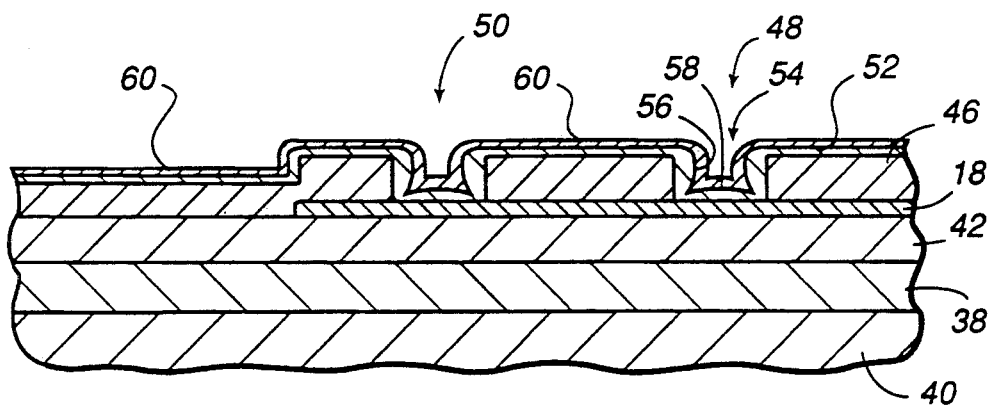
Figure 3D:
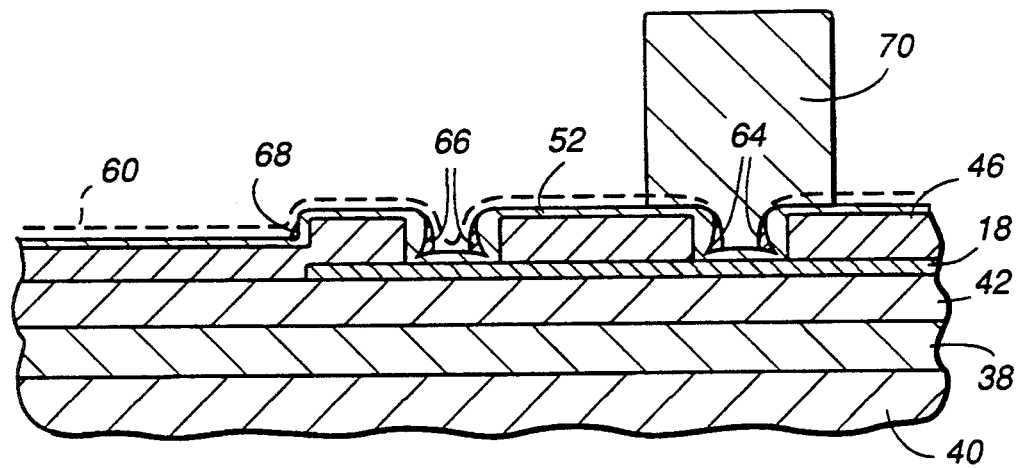

In FIG. 3c, a layer of anti-fuse material 52 is deposited over the structure of FIG. 3b and within opening 48 and via hole 50. The deposition process is substantially conformal so that the anti-fuse material 52 generally assumes the contours of the opening 48 to provide a recess 54 having sidewall portions 56 and a base 58. The preferred anti-fuse material 52 is amorphous silicon which is deposited at relatively low temperatures within a plasma enhanced chemical vapor deposition (PECVD) system such as the Precision 5000 CVD system from Applied Materials, Inc. The description thus far of the structure illustrated in FIG. 3c comprises the production of the device through step 34 of process 26.

With continuing reference to FIG. 3c, an insulating layer 60 is then deposited over the anti-fuse material 52 to a depth of approximately 2000 angstroms. This insulating layer again preferably comprises silicon dioxide. With additional reference to FIG. 3d, the insulating layer 60 is anisotropically etched away until only silicon-dioxide spacers 64 and extraneous material 66 and 68 are left adjacent vertical surfaces of the structure. This comprises the formation of the spacers step 36 of process 26.

Figure 3E:
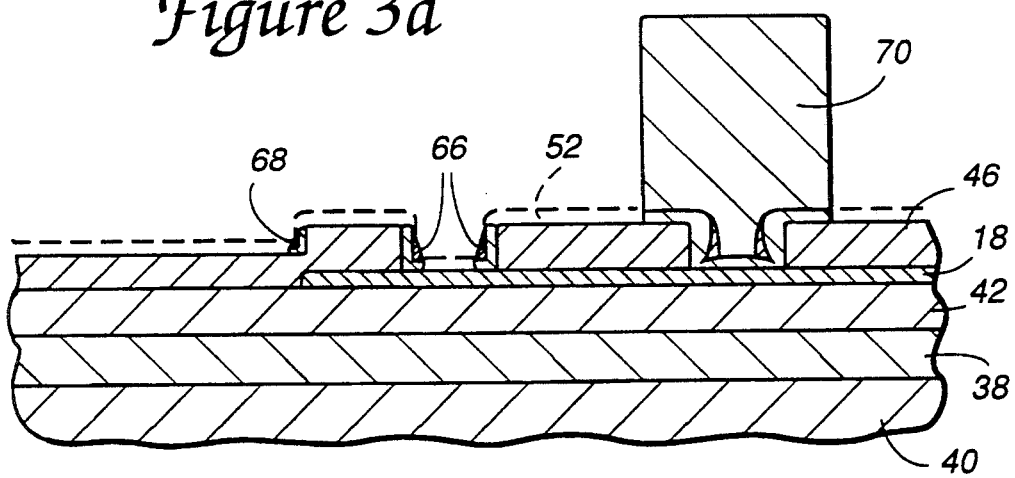

After the spacers 64 are formed a photoresist mask 70 is formed over the structure to protect the anti-fuse material 52 and the spacers 64 within the opening 48. In FIG. 3e, the anti-fuse material 52 can be etched away except where it is covered by photoresist mask 70 or the extraneous material 66 and 68. Alternatively, the extraneous material 66 and 68 can first be removed by wet etching the structure in 10:1 strength hydrofluoric acid (HF) solution. The wet etching is essentially isotropic and should remove most of the silicon dioxide from the vertical surfaces of the structure. The removal of extraneous material substantially improves the reliability of the resultant device.

Figure 3F:
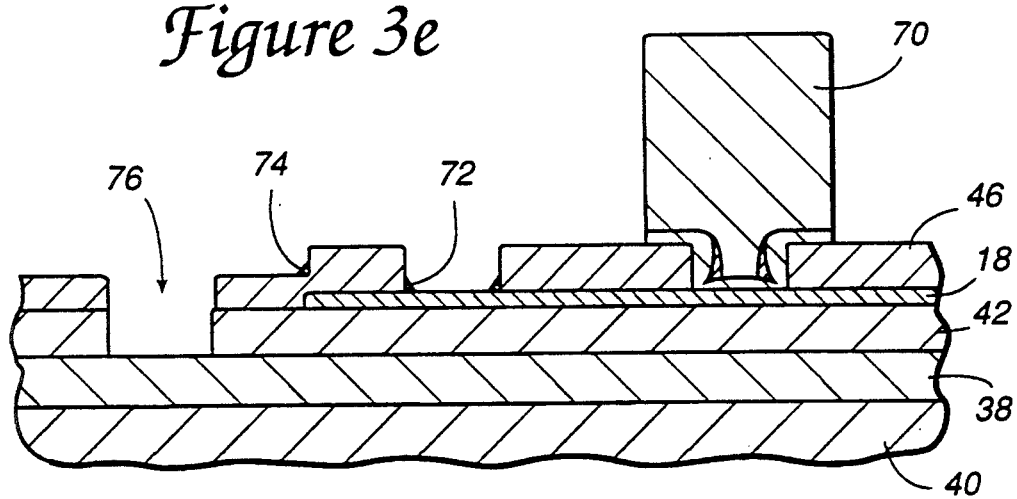

Referring now to FIG. 3f, if the extraneous material 66 and 68 is removed by the wet etch before the etching of the anti-fuse material 52 virtually all of the anti-fuse material will be removed. However, in some circumstances it may be desirable to leave a little anti-fuse material in the corners adjacent to vertical surfaces of the structure to facilitate subsequent metal step coverage. In this case, the wet etch of the extraneous material follows the etch of the anti-fuse material to leave residual anti-fuse material 72 and 74. Next, an additional patterning step is performed and a via hole 76 is formed in layers 46 and 42 down to the metal layer 38, and the masking layers are removed.

Figure 3G:
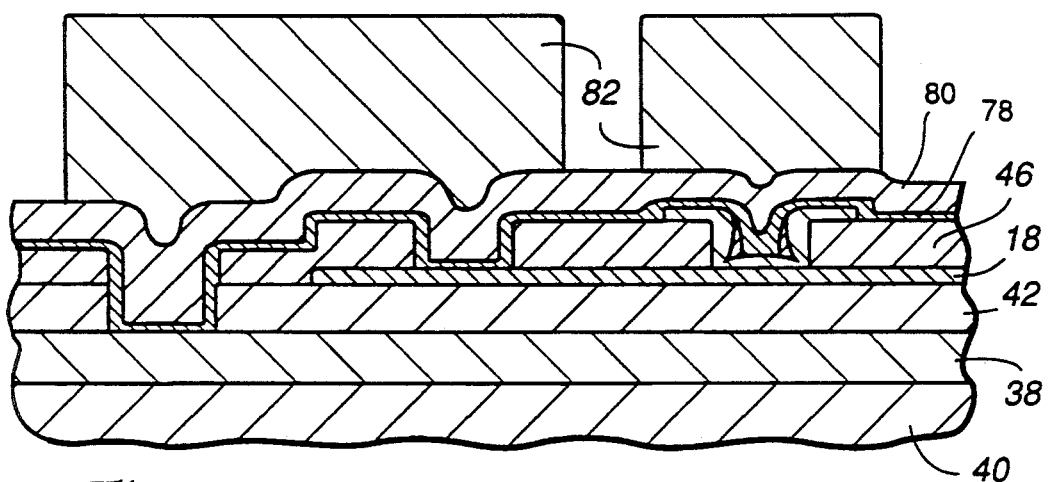

In FIG. 3g, a conductive layer 78 is conformably deposited over the surface of the structure and a metal layer 80 is deposited over the conductive layer. The conductive layer 78 is preferably a TiW-Al-TiW sandwich similar to the sandwich construction of layer 38. More specifically, conductive layer 78 includes a bottom layer of TiW approximately 2000 angstroms thick, a middle layer of 99:1 AlCu approximately 8500 angstroms thick, and a top layer of TiW approximately 800 angstroms thick. The metal layer 80 preferably comprises an 8500 angstrom thick layer of aluminum. An additional masking layer 82 is then formed over the structure.

Figure 3H:
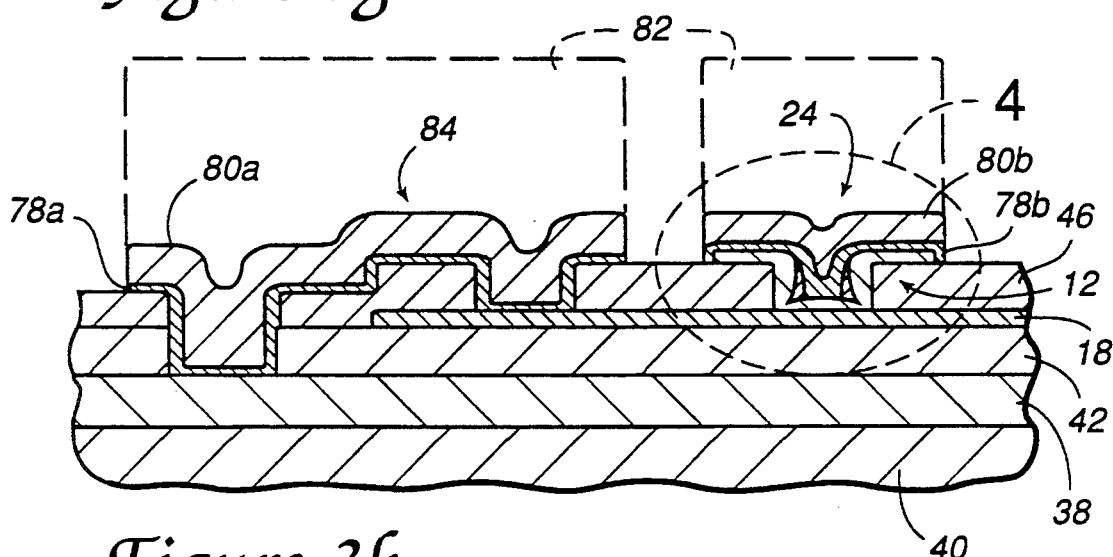

As seen in FIG. 3h, the conductive layer 78 and the metal layer 80 are then etched through the masking layer 82 and the masking layer is removed. Portions 78a and 80a of those layers comprise a connection line 84 which electrically couples the row lines 18 to the metal layer 38. Portions 78b and 80b of those layers comprise a column line 24 of the array 10 of FIG. 1. Therefore, the structure shown in this figure illustrates one of the many anti-fuse structures 12 formed at the juncture of a row line 18 and a column line 24.

The anti-fuse structures 12 of the present invention are built on top of insulating layer 42 to make the process as compatible as possible with existing processes. Since the metal layer 38 is almost universally an aluminum or aluminum alloy layer used to interconnect various devices formed on the surface of the silicon layer, it would be poor practice to form the anti-fuse structure directly on the metal layer because of the aforementioned aluminum migration problem. By forming the anti-fuse structures 12 on top of the insulating layer 42, the anti-fuse structures can be isolated from the metal layer 42 and from circuitry beneath metal layer 42. Also, forming the anti-fuse structures on top of insulating layer 42 is an add-on, modular processes which is completely independent of the process used to form the metal layer 42.

Figure 4:
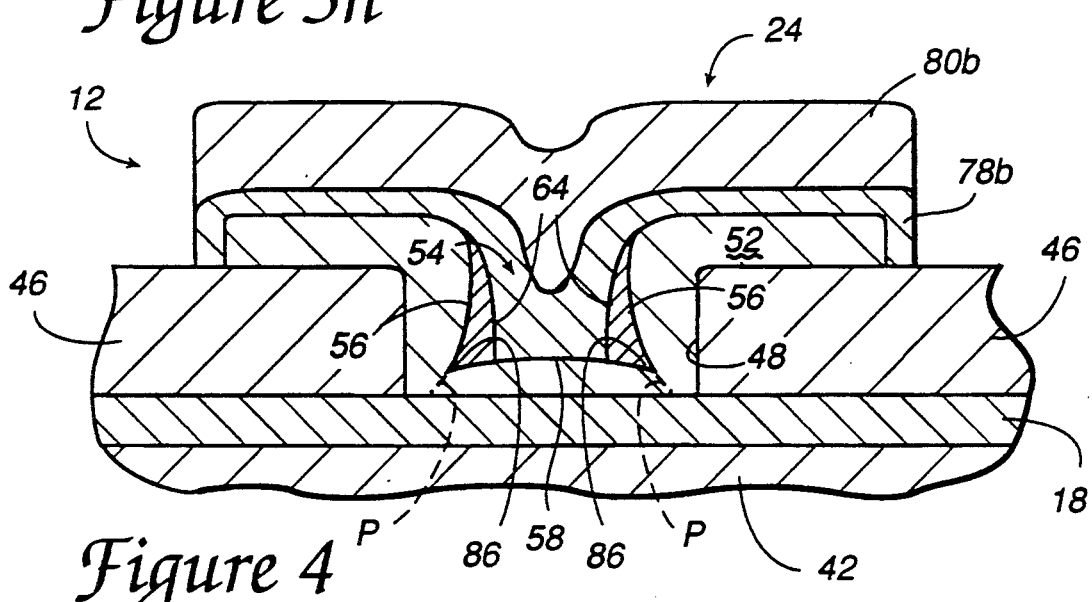
FIG. 4 is an enlarged view of the anti-fuse memory structure that is encircled by line 4 in FIG. 3.

FIG. 4, which is an enlarged view of the portion of FIG. 3h encircled by a line 4, illustrates the anti-fuse structure 12 of the present invention in greater detail. A row line 18 sits on top of an insulating layer 42. Anti-fuse material 52 is conformably deposited within opening 48 of an insulating layer 46 to form a recess 54. The anti-fuse material 52, due to the deposition process, has cusps at the interface 86 between sidewall portions 56 and base portion 58 of the recess 54. Silicon dioxide spacers adhere to the sidewall portions 56 and cover the interface 86 as well as a part of the base portion 58. The portions 78b and 80b of the conductive layer 78 and metal layer 80, respectively, comprise a column line 24.

An anti-fuse structure 12 initially has a very high resistance in the order of 1-2 gigohms. If a programming voltage of about 10-12 volts is applied between row line 18 and column line 24, the amorphous silicon at base portion 58 will melt and will then crystallize when the high voltage is removed. After this melting and crystallization process the resistance of the anti-fuse structure 12 will be in the order of 150 ohms. In consequence, an anti-fuse structure 12 can be permanently and irreversibly programmed by applying the programming voltage between the row line and column line with which it is associated. When used in a field programmable gate array, the conductive anti-fuses will couple selected logical gates together to perform user designed functions. When used as PROM memory cells, high resistance anti-fuses can represent a first logical state while low resistance anti-fuses can represent a second logical state.

If the spacers 64 of the present invention were not provided, there is the possibility that a low resistance path, such as a path P, could be formed between the row line 18 and the column line 24. The low resistance path could cause an unprogrammed anti-fuse structure 12 to be falsely read as a programmed anti-fuse structure, thereby rendering the entire array 10 unreliable. Also, if the cusped interface 86 is not covered by the spacers 64 of the present invention it is possible that a voltage below the programming voltage level could melt and recrystallize the thin anti-fuse material along a path P. By providing the spacers 64, the contact between the column line 24 and the base portion 58 of the anti-fuse material will be in the thicker, central section of base portion 58. The addition of spacers 64 therefore greatly increase the reliability of the anti-fuse structure array 10.

While this invention has been described in terms of several preferred embodiments, it is contemplated that various alterations and permutations thereof will become apparent to those skilled in the art. It is therefore intended that the appended claims include all such alterations and permutations as fall within the true spirit and scope of the present invention.

What is claimed is:

1. A method for making an anti-fuse structure comprising:

providing a substrate surface;

forming an insulating layer over said substrate surface;

forming an opening in said insulating layer which extends down to said substrate surface;

depositing an anti-fuse material into said opening such that it generally conforms to the contours of said opening to form a recess having sidewall portions and a base portion which meet at an interface; and forming insulating spacers within said recess of said anti-fuse material to substantially cover said interface between said sidewall portion and said base portion.

2. A method for making an anti-fuse structure as recited in claim 1 wherein said step of providing a substrate surface comprises:
   depositing a conductive material on a supporting surface; and
   patterning said conductive material.

3. A method for making an anti-fuse structure as recited in claim 1 wherein said step of forming insulating spacers within said recess comprises:
   depositing an insulating spacer material over said anti-fuse material; and
   etching said insulating spacer material to leave said insulating spacers.

4. A method for making an anti-fuse structure as recited in claim 3 wherein said insulating spacer material comprises silicon dioxide.

5. A method for making an array of anti-fuse structures comprising:
   providing a substrate surface;
   depositing an oxide layer over said substrate surface;
   etching said oxide layer to form therein a plurality of openings which extend down to said substrate surface;
   depositing amorphous silicon into said plurality of openings such that said amorphous silicon generally conforms to the contours of said plurality of openings to provide, within each opening, a recess having sidewall portions and a base portion which meet at an interface; and
   forming oxide spacers within said recesses of said amorphous silicon to substantially cover said interface between said sidewall portion and said base portion of each recess.

6. A method for making an array of anti-fuse structures as recited in claim 5 wherein said step of providing a substrate surface comprises:
   depositing a conductive material on a supporting surface; and
   patterning said conductive material.

7. A method for making an array of anti-fuse structures as recited in claim 6 wherein said conductive material electrically couples a first plurality of said anti-fuse structures.

8. A method for making an array of anti-fuse structures as recited in claim 7 wherein said conductive material comprises an alloy of titanium and tungsten.

9. A method for making an array of anti-fuse structures as recited in claim 7 further comprising:
   depositing a conductive material over said amorphous silicon and said oxide spacers; and
   patterning said conductive material to electrically couple a second plurality of anti-fuse structures which has an anti-fuse structure in common with said first linear arrangement of anti-fuse structures.

10. A method for making an array of anti-fuse structures as recited in claim 5 wherein said step of providing a substrate surface comprises:
    depositing a first conductive material on a supporting surface;
    patterning said first conductive material;
    depositing an insulating material over said first conductive material; depositing a second conductive material over said insulating material; and patterning said second conductive material.

11. A method for making an array of anti-fuse structures as recited in claim 9 wherein said first conductive material comprises aluminum and wherein said second conductive material comprises an alloy of titanium and tungsten.

12. A method for making an array of anti-fuse structures as recited in claim 9 wherein said second conductive material electrically couples a first plurality of said anti-fuse structures.

13. A method for making an array of anti-fuse structures as recited in claim 11 further comprising:
    forming a via hole in said insulating material; and
    electrically coupling said first conductive material to said second conductive material through said via hole.

14. A method for making an array of anti-fuse structures as recited in claim 5 wherein said step of forming said oxide spacers comprises:
    depositing oxide within said recesses such that said oxide substantially conforms to the contours of said recess; and
    etching said oxide to form said sidewall spacers.

15. A method for making an array of anti-fuse structures as recited in claim 13 wherein said step of forming said oxide spacers further comprises: masking said sidewall spacers within said recesses of said anti-fuse material; and etching oxide residue outside of said recesses of said anti-fuse material.

16. A method for making an array of anti-fuse structures as recited in claim 15 wherein said step of etching said oxide residue comprises contacting said oxide residue with a liquid solution including hydrofluoric acid.

* * * * *